US009525077B1

(12) United States Patent
Bi et al.

(10) Patent No.: US 9,525,077 B1
(45) Date of Patent: Dec. 20, 2016

(54) INTEGRATION OF A BARITT DIODE

(71) Applicant: Texas Instruments Incorporated, Dallas, TX (US)

(72) Inventors: Xiaochuan Bi, Sunnyvale, CA (US); Tracey L Krakowski, Palo Alto, CA (US); Suman Banerjee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/932,930

(22) Filed: Nov. 4, 2015

(51) Int. Cl.
| | |
|---|---|
| *H01L 21/70* | (2006.01) |
| *H01L 29/864* | (2006.01) |
| *H01L 27/06* | (2006.01) |
| *H01L 29/06* | (2006.01) |
| *H01L 29/161* | (2006.01) |
| *H01L 29/165* | (2006.01) |
| *H01L 29/66* | (2006.01) |
| *H01L 21/762* | (2006.01) |
| *H01L 21/265* | (2006.01) |
| *H01L 29/47* | (2006.01) |
| *H01L 29/78* | (2006.01) |
| *H01L 29/737* | (2006.01) |
| *H01L 23/66* | (2006.01) |

(52) U.S. Cl.
CPC ....... *H01L 29/864* (2013.01); *H01L 21/26513* (2013.01); *H01L 21/76224* (2013.01); *H01L 23/66* (2013.01); *H01L 27/0629* (2013.01); *H01L 27/0664* (2013.01); *H01L 29/0649* (2013.01); *H01L 29/0653* (2013.01); *H01L 29/161* (2013.01); *H01L 29/165* (2013.01); *H01L 29/47* (2013.01); *H01L 29/66159* (2013.01); *H01L 29/7378* (2013.01); *H01L 29/7848* (2013.01); *H01L 2223/6683* (2013.01)

(58) Field of Classification Search
CPC ............ H01L 21/26513; H01L 23/66; H01L 27/0629; H01L 27/0664; H01L 29/864
USPC ........................................ 257/192, 368, 379
See application file for complete search history.

(56) References Cited

U.S. PATENT DOCUMENTS

| | | | | |
|---|---|---|---|---|
| 6,657,240 B1 * | 12/2003 | Chi | ........................ | H01L 29/864 257/162 |
| 2009/0016094 A1 * | 1/2009 | Rinerson | ............. | G11C 11/5685 365/148 |

* cited by examiner

*Primary Examiner* — Benjamin Sandvik
*Assistant Examiner* — Herve Assouman
(74) *Attorney, Agent, or Firm* — Jacqueline J. Garner; Charles A. Brill; Frank D. Cimino

(57) ABSTRACT

A vertically oriented BARITT diode is formed in an integrated circuit. The BARITT diode has a source proximate to the top surface of the substrate of the integrated circuit, a drift region immediately below the source in the semiconductor material of the substrate, and a collector in the semiconductor material of the substrate immediately below the drift region. A dielectric isolation structure laterally surrounds the drift region, extending from the source to the collector. The source may optionally include a silicon germanium layer or may optionally include a schottky barrier contact.

20 Claims, 11 Drawing Sheets

INTEGRATION OF A BARITT DIODE

FIELD OF THE INVENTION

This invention relates to the field of integrated circuits. More particularly, this invention relates to microwave components in integrated circuits.

BACKGROUND OF THE INVENTION

Most microwave radar systems for low cost applications such as automotive collision warning systems use Doppler signal processing. The Doppler effect (or Doppler shift) is the change in frequency of a reflected wave (or other periodic event) for an observer moving relative to its target. Doppler signal processing may be used to separate reflecting signal from spurious noise and to measure moving target velocity. However, Doppler detection is challenging, because the return signal is from reflection not from a baseband station. Thus, a low noise Doppler detector is needed. The BARrier Injection Transit-Time (BARITT) diode, as a discrete device, has demonstrated high sensitivity in self-mixing microwave Doppler systems. However, discrete device systems have undesirably high fabrication cost and complexity for low cost applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a transistor and a vertically oriented BARITT diode. The BARITT diode has a source disposed proximate to a top surface of a substrate of the integrated circuit, a drift region disposed in semiconductor material of the substrate below the source, and a collector disposed in the semiconductor material of the substrate below the drift region. A dielectric isolation structure laterally surrounds the drift region, extending from the source to the collector.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A vertically oriented BARITT diode may be formed in an integrated circuit by forming a collector of a first conductivity type in silicon-based semiconductor material of a substrate of the integrated circuit at a depth of at least one micron below a top surface of the substrate, and forming a source directly over the collector, proximate to the top surface. The semiconductor material of the substrate between the source and the collector provides a drift region of the BARITT diode. A dielectric isolation structure laterally surrounds the drift region and extends from the source to the collector. The source may be a heavily doped region of the semiconductor material of the substrate, may include a schottky barrier, and may include a silicon-germanium layer. The collector may be a buried layer in the substrate. The dielectric isolation structure may be field oxide.

Examples disclosed herein will describe BARITT diodes with p-type drift regions. It will be recognized that analogous BARITT diodes with n-type drift regions may be formed with appropriate changes in dopant and conductivity polarities.

Figure 1:
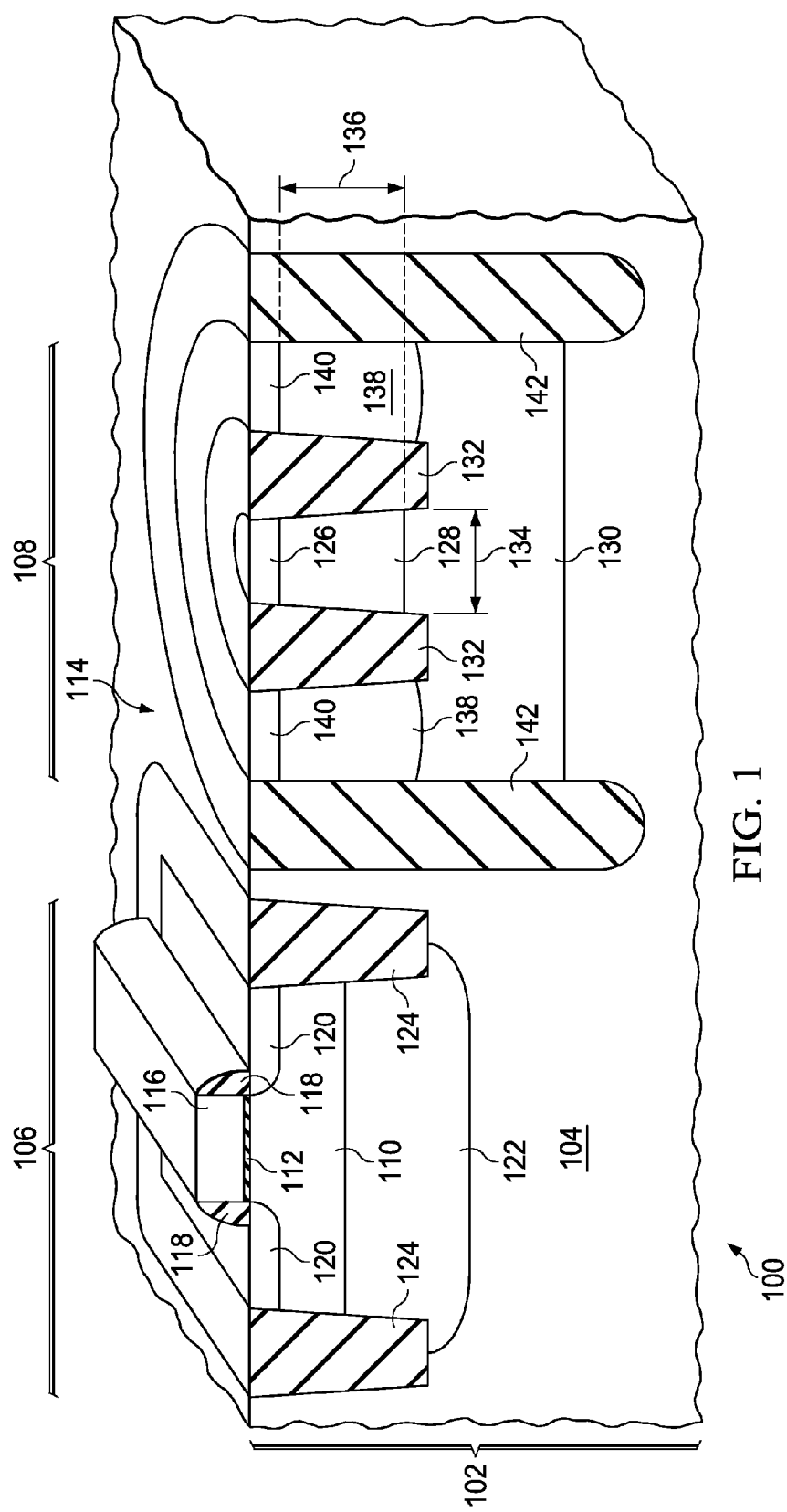
FIG. 1 is a cross section of an example integrated circuit containing a BARITT diode.

FIG. 1 is a cross section of an example integrated circuit containing a BARITT diode. The integrated circuit 100 includes a substrate 102 which includes a p-type semiconductor material 104 having a dopant density of $1 \times 10^{14}$ cm$^{-3}$ to $1 \times 10^{16}$ cm$^{-3}$, which corresponds to a bulk resistivity of about 100 ohm-cm to 1 ohm cm. The integrated circuit 100 includes an n-channel metal oxide semiconductor (NMOS) transistor 106 and the BARITT diode 108.

The NMOS transistor 106 is disposed in a shallow p-type well 110 and includes a gate dielectric layer 112 disposed at a top surface 114 of the substrate 102 and a gate 116 disposed on the gate dielectric layer 112. Optional gate sidewall spacers 118 may be disposed adjacent to the gate 116. The NMOS transistor includes n-type source and drain regions 120 in the substrate 102 adjacent to the gate 116. The shallow p-type well 110 may be isolated from the p-type semiconductor material 104 by a first deep n-type well 122 which extends in the substrate 102 below the shallow p-type well 110. Field oxide 124 with a shallow trench isolation (STI) structure, as depicted in FIG. 1, may laterally isolate the NMOS transistor 106.

The BARITT diode 108 includes a source 126, a vertically oriented drift region 128 disposed in the substrate 102 immediately below the source 126, and a collector 130 disposed in the substrate 102 immediately below the drift region 128. A dielectric isolation structure 132 laterally surrounds the drift region 128. The drift region 128 and the dielectric isolation structure 132 extend vertically from the source 126 to the collector 130. The drift region 128 is free of an external electrical connection besides the source 126 and the collector 130.

In the instant example, the source 126 may be an n-type region in the substrate 102. The source 126 of the BARITT diode 108 and the source and drain regions 120 of the NMOS transistor 106 may have substantially equal n-type dopant distributions as a result of being formed concurrently. The drift region 128 may be a portion of the p-type semiconductor material 104, with an average dopant density of $1\times10^{14}$ cm$^{-3}$ to $1\times10^{16}$ cm$^{-3}$. The drift region 128 may be free of additional dopants beyond the dopants of the p-type semiconductor material 104, so that a dopant distribution in the drift region 128 is advantageously more uniform than obtained by implanting dopants into the substrate 102. The collector 130 may be an n-type buried layer 130 with an average dopant density of at least $1\times10^{18}$ cm$^{-3}$, which may advantageously reduce a series resistance of the BARITT diode 108. The dielectric isolation structure 132 may be field oxide 124 formed by an STI process, possibly formed concurrently with the field oxide 124 isolating the NMOS transistor 106. The drift region 128 may have an average width 134 of 1 micron to 5 microns with a round lateral shape which may advantageously reduce a size of the BARITT diode 108 compared to other lateral shapes. The round lateral shape may also reduce recombination of carriers in the drift region 128 at the dielectric isolation structure 132, compared to other lateral shapes, which may advantageously reduce noise in current through the BARITT diode 108. The drift region 128 may have a height 136 of 2 microns to 5 microns to provide a desired operating frequency of the BARITT diode 108.

In the instant example, the BARITT diode 108 may include a second deep n-type well 138 in the substrate 102 outside of the dielectric isolation structure 132, extending to the collector 130. The second deep n-type well 138 may have a similar distribution of n-type dopants as the first deep n-type well 122 as a result of being formed concurrently. The BARITT diode 108 may further include an n-type collector contact region 140 in the substrate 102 above and contacting the second deep n-type well 138. The collector contact region 140 and the source and drain regions 120 of the NMOS transistor 106 may have substantially equal dopant distributions as a result of being formed concurrently. The BARITT diode 108 may be surrounded by an optional deep trench 142 which laterally isolates the collector 130 and the second deep n-type well 138 from the p-type semiconductor material 104. Integrating the BARITT diode 108 in the integrated circuit 100 with other components such as the NMOS transistor 106 may advantageously reduce a fabrication and assembly cost of an electronic system containing the integrated circuit 100.

Figure 2A:
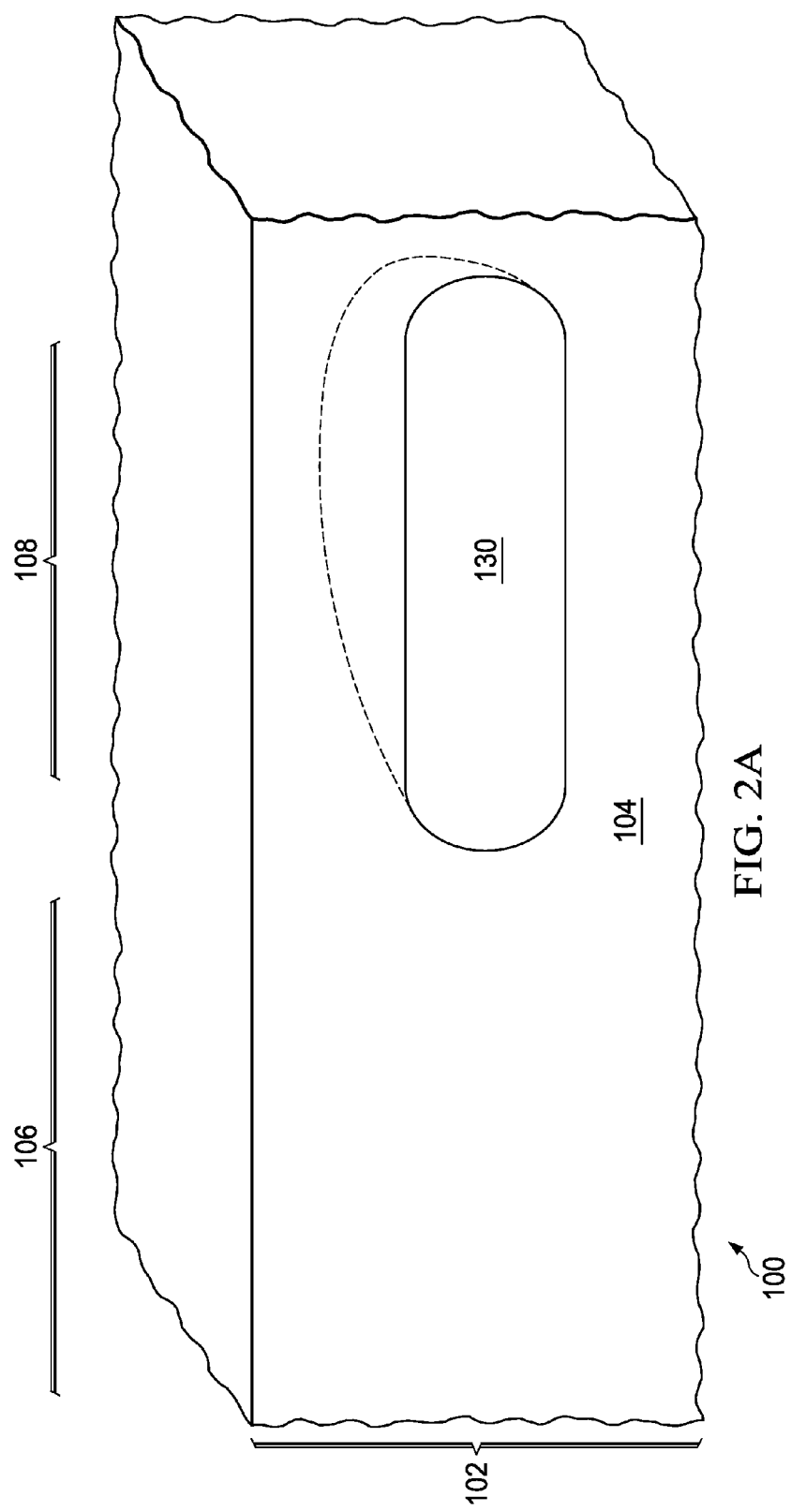
FIG. 2A through FIG. 2F are cross sections of the integrated circuit of FIG. 1, depicted in key stages of an example formation process.

FIG. 2A through FIG. 2F are cross sections of the integrated circuit of FIG. 1, depicted in key stages of an example formation process. Referring to FIG. 2A, formation of the integrated circuit 100 begins with providing the substrate 102, which may be a silicon wafer or other suitable substrate. The collector 130 is formed in the p-type semiconductor material 104 of the substrate 102 in the area for the BARITT diode 108. The substrate 102 may start as a silicon wafer with a first portion of the p-type semiconductor material 104 extending to a top surface of the silicon wafer. The first portion of the p-type semiconductor may possibly be a first p-type epitaxial layer formed on a bulk heavily doped silicon wafer. N-type dopants such as arsenic and antimony are implanted into the portion of the p-type semiconductor material 104 in the area for the BARITT diode 108 and subsequently diffused during a thermal drive process which grows an oxide layer on the silicon wafer. The oxide layer is removed and a second p-type epitaxial layer is formed on the first epitaxial layer to provide the substrate 102. The n-type dopants further diffuse during formation of the second epitaxial layer to form the collector 130 as the n-type buried layer 130. Other methods of forming the collector 130 are within the scope of the instant example.

Figure 2B:
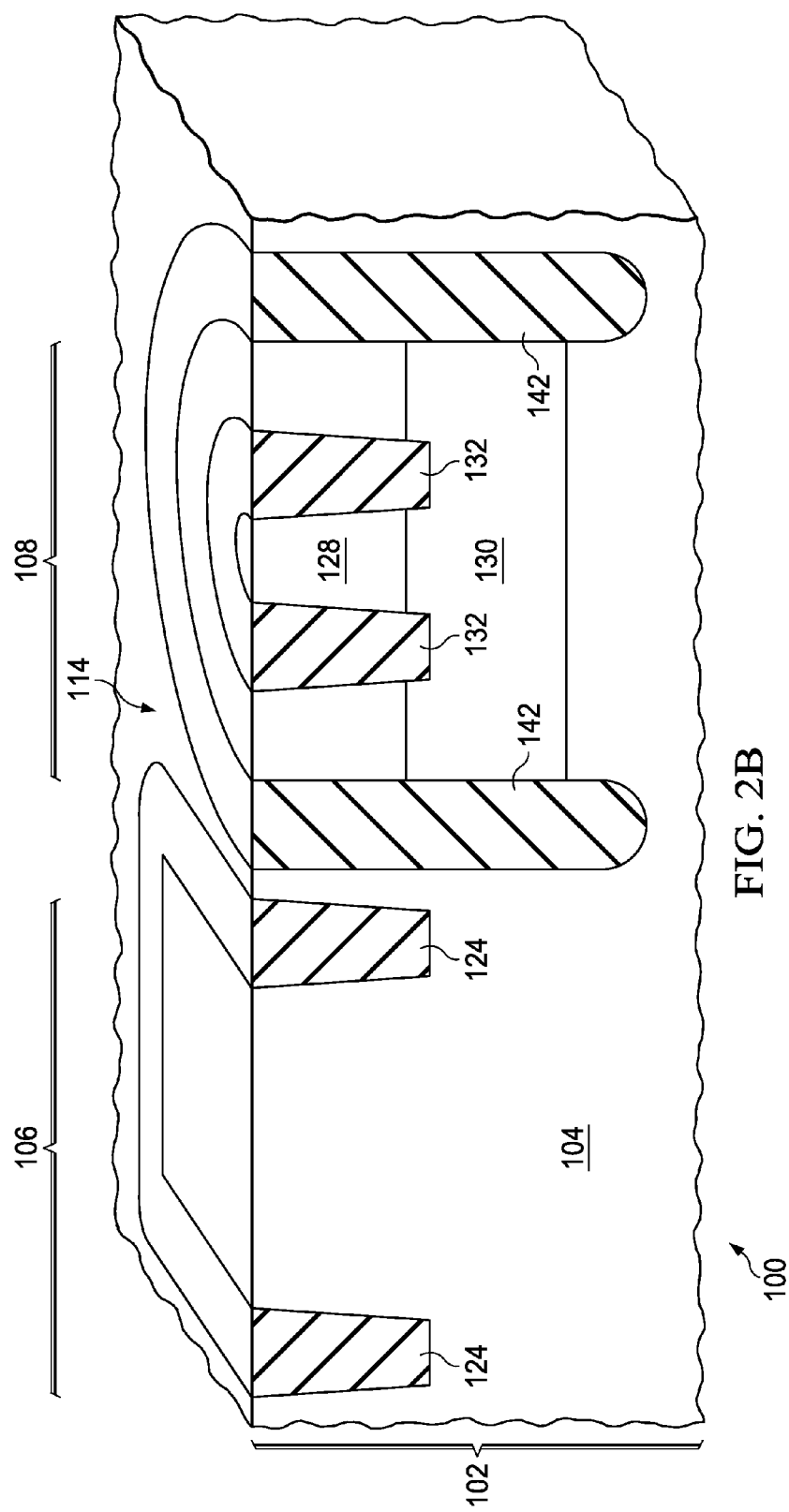

Referring to FIG. 2B, the optional deep trench 142 may be formed by a deep reactive ion etch (DRIE) process followed by thermal oxide growth and oxide fill by semi-atmospheric chemical vapor deposition (SACVD). The deep trench 142 may possibly include a field plate of polycrystalline silicon, referred to herein as polysilicon. The deep trench 142 may be formed concurrently with other deep trenches in the integrated circuit 100, advantageously reducing fabrication cost. The field oxide 124 around the area for the NMOS transistor 106 and the dielectric isolation structure 132 around the drift region 128 in the area for the BARITT diode 108 may be formed concurrently using an STI process. The STI process begins with forming a polish stop layer such as silicon nitride over the top surface 114 of the substrate 102. Isolation trenches are etched through the stop layer and into the substrate 102. A layer of thermal oxide is grown on sidewalls and bottoms of the isolation trenches, and the isolation trenches are subsequently filled, primarily with silicon dioxide-based dielectric material. The dielectric material may be formed, for example, by SACVD, high density plasma (HDP), atmospheric chemical vapor deposition (APCVD) or a high aspect ratio process (HARP) using ozone and tetraethyl orthosilicate (TEOS). The dielectric material is subsequently removed from over the stop layer by a chemical mechanical polish (CMP) process, leaving the dielectric material in the isolation trenches. The stop layer is subsequently removed. In the instant example, the deep trench 142 surrounds and abuts the collector 130.

Figure 2C:
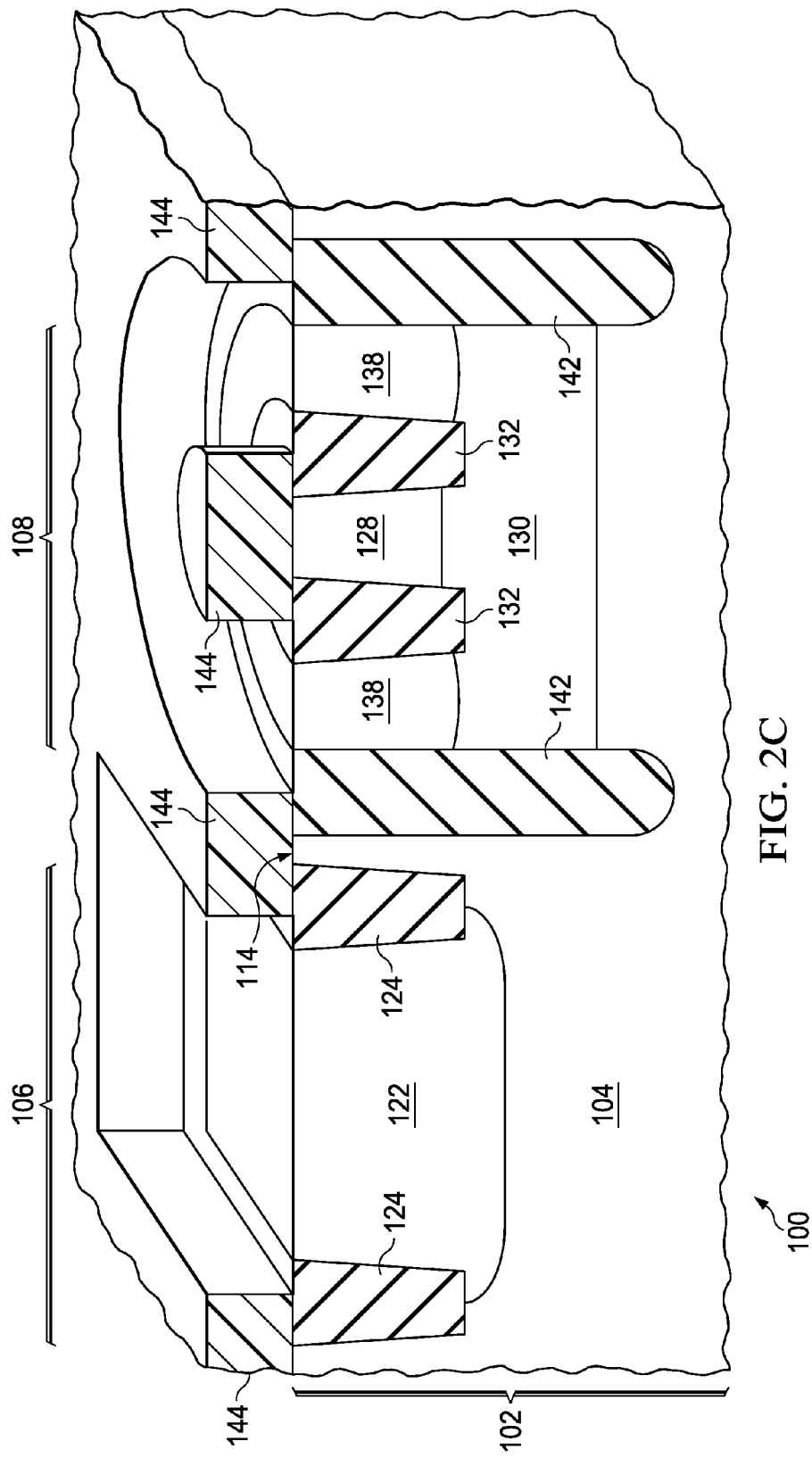

Referring to FIG. 2C, a deep n-well mask 144 is formed over the substrate 102 so as to expose the area for the BARITT diode 108, blocking the drift region 128. In the instant example, the deep n-well mask 144 also exposes the area for the NMOS transistor 106. The deep n-well mask 144 may include photoresist and possibly anti-reflection material, and may be formed by a photolithographic process.

N-type dopants such as phosphorus are implanted into the substrate 102 where exposed by the deep n-well mask 144. The n-type dopants may have a total dose of $1\times10^{12}$ cm$^{-2}$ to $1\times10^{13}$ cm$^{-2}$. The substrate 102 is subsequently annealed to activate the implanted n-type dopants. In the area for the BARITT diode 108, the implanted n-type dopants form the second deep n-type well 138 outside of the dielectric isolation structure 132, extending down to the collector 130. In the area for the NMOS transistor 106, the implanted n-type dopants form the first deep n-type well 122. Forming the second deep n-type well 138 and the first deep n-type well 122 concurrently may advantageously reduce fabrication cost and complexity of the integrated circuit 100. The deep n-well mask 144 is subsequently removed, for example by an ash process followed by a wet clean process.

Figure 2D:
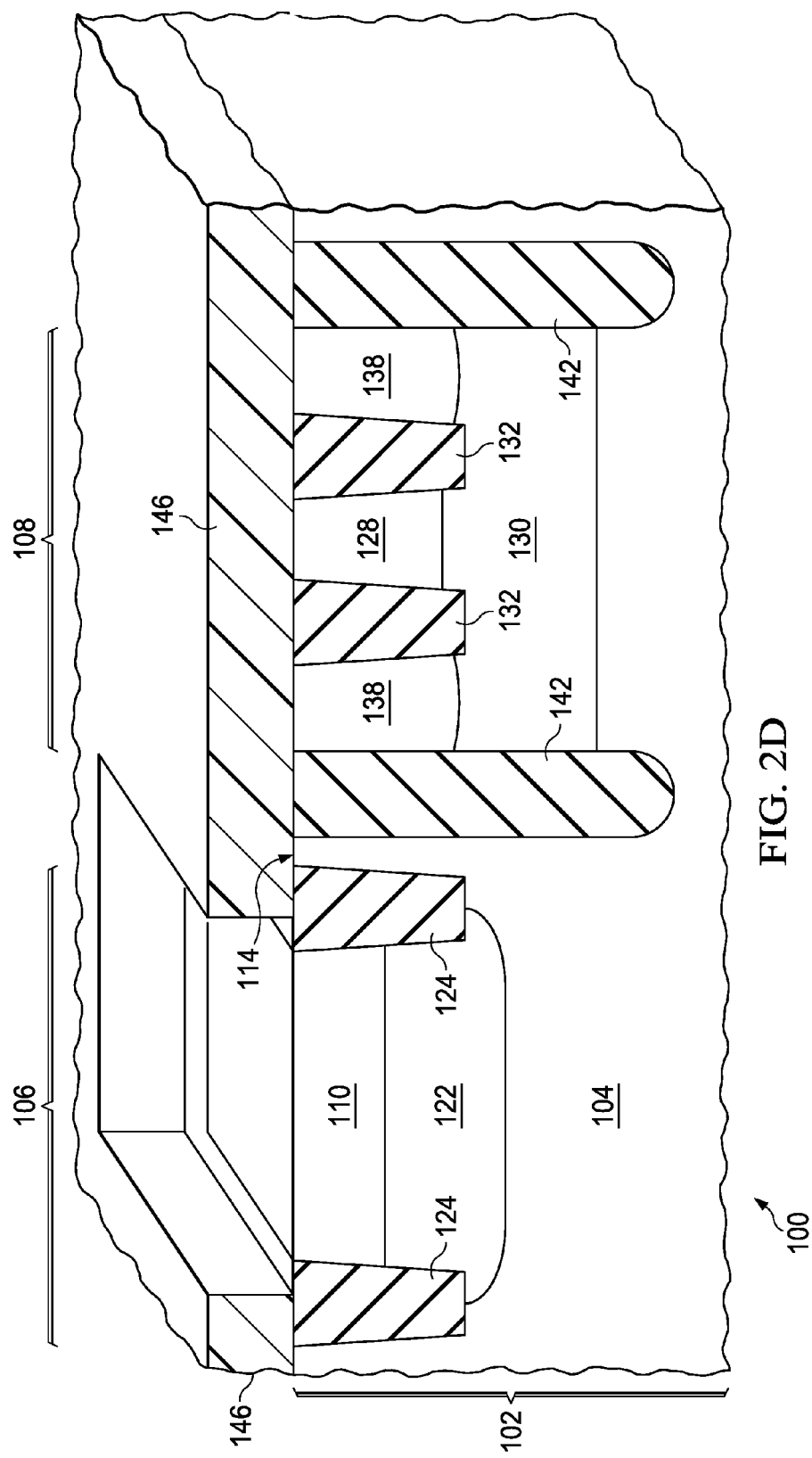

Referring to FIG. 2D, a shallow p-well mask 146 is formed over the substrate 102 so as to expose the area for the NMOS transistor 106 and cover the area for the BARITT diode 108. The shallow p-well mask 146 may be formed by a similar process as the deep n-well mask 144 of FIG. 2C, although the shallow p-well mask 146 may be thinner than the deep n-well mask 144 due to a lower implant energy of p-type dopants blocked by the shallow p-well mask 146 than an implant energy of n-type dopants blocked by the deep n-well mask 144.

P-type dopants such as boron are implanted into the substrate 102 where exposed by the shallow p-well mask 146. The p-type dopants may be implanted in several doses with a total dose of $1\times10^{12}$ cm$^{-2}$ to $1\times10^{14}$ cm$^{-2}$. The substrate 102 is subsequently annealed to activate the implanted p-type dopants. In the area for the NMOS transistor 106, the implanted p-type dopants form the shallow p-type well 110 which provides a desired threshold voltage for the NMOS transistor 106. In the instant example, the drift region 128 of the BARITT diode 108 is free of additional dopants beyond the dopants of the p-type semiconductor material 104. The shallow p-well mask 146 is subsequently removed, for example as described with respect to the deep n-well mask 144.

Figure 2E:
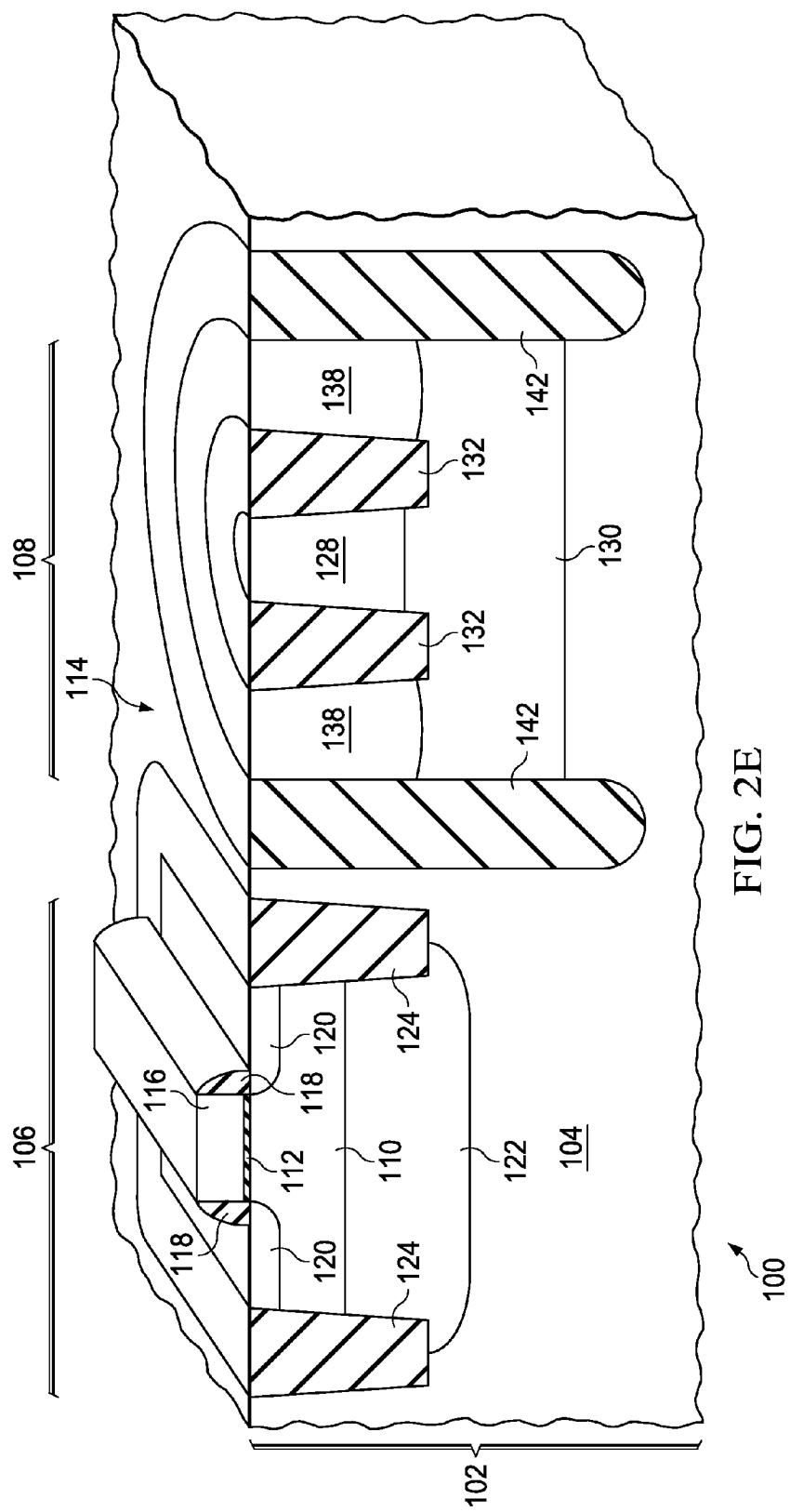

Referring to FIG. 2E, the gate dielectric layer 112 is formed at the top surface 114 of the substrate 102 and the gate 116 is formed on the gate dielectric layer 112. The gate dielectric layer 112 may be formed by thermal oxidation of silicon in the substrate 102. The gate 116 may be formed by forming a layer of polysilicon on the gate dielectric layer 112, forming a gate mask over the layer of polysilicon, and etching the layer of polysilicon to leave the gate 116. The gate sidewall spacers 118 are subsequently formed adjacent to lateral surfaces of the gate 116. The gate sidewall spacers 118 may be formed, for example, by forming one or more conformal layers of silicon nitride and/or silicon dioxide over the gate 116 and the top surface 114 of the substrate 102, then removing the conformal layers from horizontal surfaces of the gate 116 and the top surface 114 by an anisotropic plasma etch such as a reactive ion etch (RIE) process, leaving the gate sidewall spacers 118 in place adjacent to the gate 116.

Figure 2F:
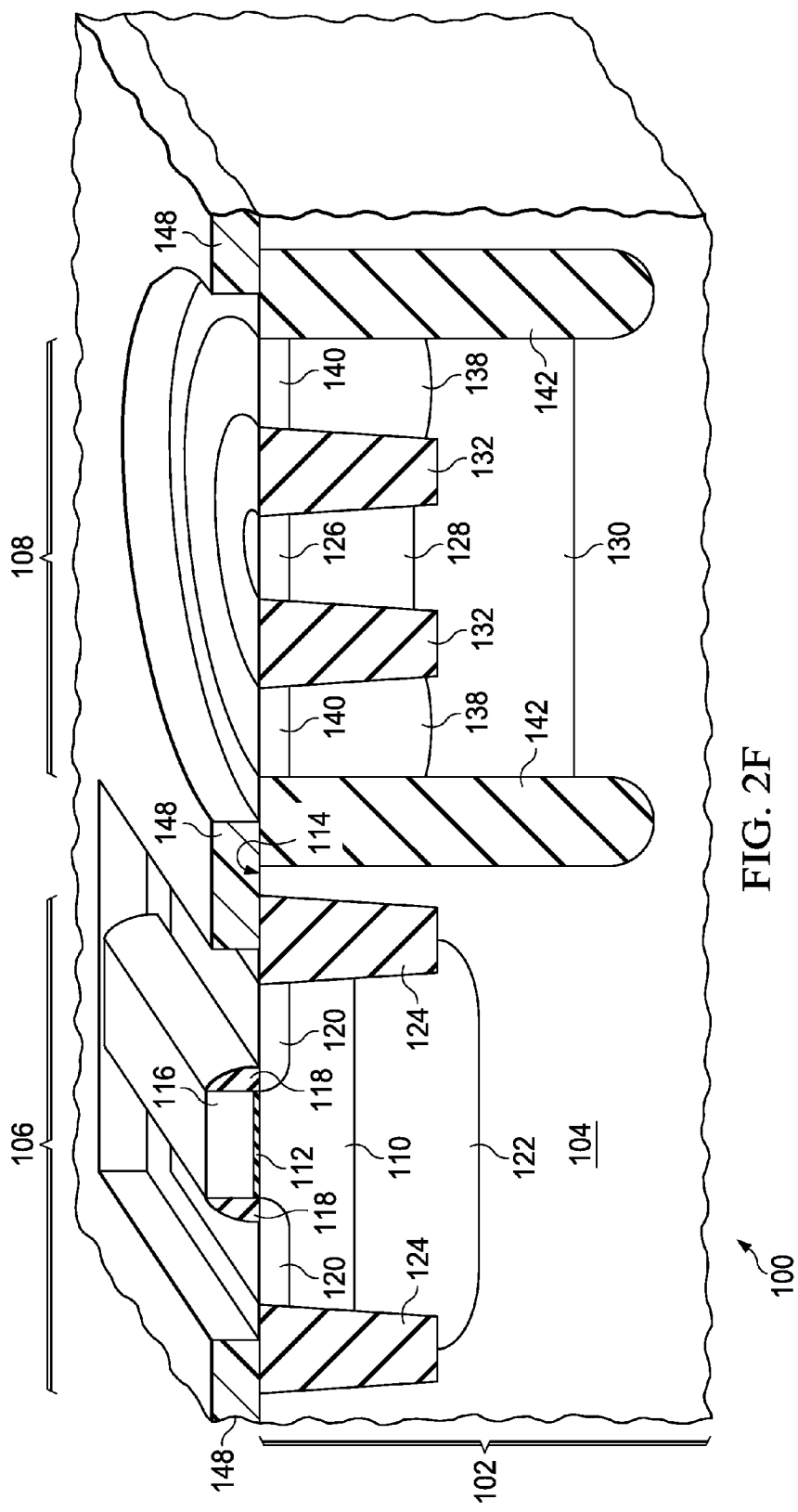

Referring to FIG. 2F, a source/drain mask 148 is formed over the substrate 102 so as to expose the area for the NMOS transistor 106 and the area of the second deep n-type well 138 of the BARITT diode 108. In the instant example, the source/drain mask 148 also exposes the area for the drift region 128 of the BARITT diode 108. The source/drain mask 148 may be formed by a similar process as the shallow p-well mask 146 of FIG. 2D, although the source/drain mask 148 may be thinner than the shallow p-well mask 146 due to a lower implant energy of n-type dopants blocked by the source/drain mask 148 than an implant energy of p-type dopants blocked by the shallow p-well mask 146.

N-type dopants such as phosphorus, arsenic and possibly antimony are implanted into the substrate 102 where exposed by the source/drain mask 148. The n-type dopants may have a total dose of $1\times10^{14}$ cm$^{-2}$ to $1\times10^{16}$ cm$^{-2}$. The substrate 102 is subsequently annealed to activate the implanted n-type dopants. In the area for the NMOS transistor 106, the implanted n-type dopants form the n-type source and drain regions 120 in the substrate 102 adjacent to the gate 116. In the area for the BARITT diode 108, the implanted n-type dopants form the n-type collector contact region 140 in the substrate 102 above and contacting the second deep n-type well 138, and form the source 126 as an n-type diffused region 126 over the drift region 128. The source/drain mask 148 is subsequently removed, for example as described with respect to the deep n-well mask 144 of FIG. 2C, to provide the structure of FIG. 1.

Figure 3:
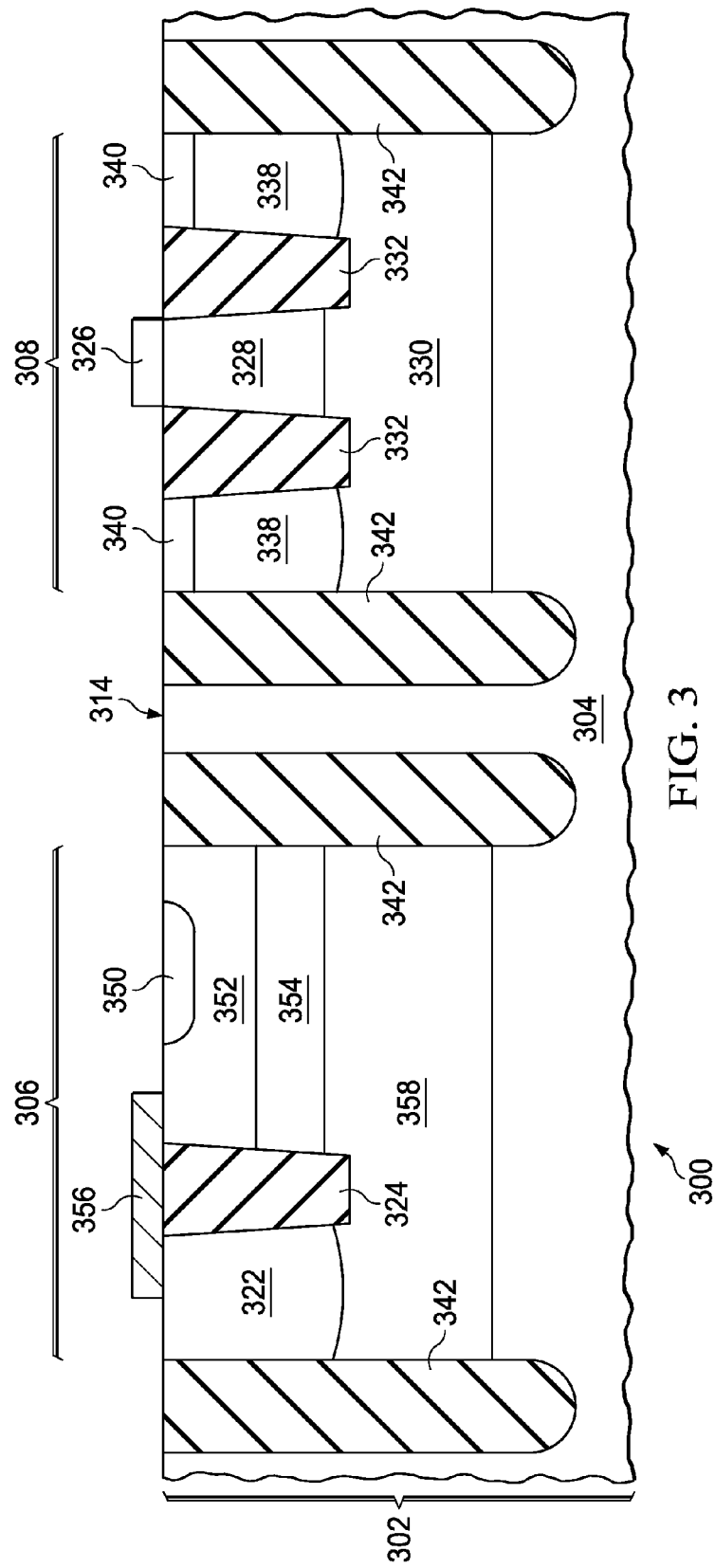
FIG. 3 is a cross section of another example integrated circuit containing a BARITT diode.

FIG. 3 is a cross section of another example integrated circuit containing a BARITT diode. The integrated circuit 300 is formed on a substrate 302 which includes a p-type semiconductor material 304 having a dopant density of $1\times10^{14}$ cm$^{-3}$ to $1\times10^{16}$ cm$^{-3}$. The integrated circuit 300 includes an NPN schottky bipolar transistor 306 and the BARITT diode 308.

The NPN schottky bipolar transistor 306 has an n-type emitter 350 formed in the substrate 302, extending from a top surface 314 of the substrate 302 to a depth of less than 1 micron. The emitter 350 may have a dopant density greater than $1\times10^{18}$ cm$^{-3}$, and may be formed by implanting n-type dopants such as phosphorus, arsenic and possibly antimony into the substrate 302 followed by annealing the substrate 302 to activate the implanted n-type dopants. The NPN schottky bipolar transistor 306 has a p-type base 352 formed in the substrate 302 under, and surrounding, the emitter 350. The base 352 extends to the top surface 314 of the substrate 302 and may extend to a depth of 1 micron to 3 microns in the substrate 302. The base 352 may be formed as a p-type well as described in reference to FIG. 2D. The NPN schottky bipolar transistor 306 has an n-type collector 354 formed in the substrate 302 under, and surrounding the base 352. The collector 354 may be formed as a deep n-type well as described in reference to FIG. 2C. The collector 354 may be augmented by an n-type buried layer 358 formed in the substrate 302 under, and contacting, the collector 354. The n-type buried layer 358 may be formed as described in reference to FIG. 2A. A collector contact region 322 is formed as a heavily doped n-type sinker in the substrate 302 to connect to the n-type buried layer 358. The collector contact region 322 is laterally isolated from the base 352 by field oxide 324. A schottky barrier contact 356 is formed at the top surface 314 of the substrate 302, contacting the base 352 and the collector contact region 352 of the NPN schottky bipolar transistor 306. The schottky barrier contact 356 may include, for example molybdenum, platinum, chromium, tungsten, platinum silicide, or palladium silicide. The NPN schottky bipolar transistor 306 may be laterally surrounded by a deep trench 342 as depicted in FIG. 3.

The BARITT diode 308 includes a source 326, a vertically oriented drift region 328 formed in the substrate 302 immediately below the source 326, and a collector 330 disposed in the substrate 302 immediately below the drift region 328. A dielectric isolation structure 332 laterally surrounds the drift region 328. The drift region 328 and the dielectric isolation structure 332 extend vertically from the source 326 to the collector 330. The drift region 328 is free of an external electrical connection besides the source 326 and the collector 330.

In the instant example, the source 326 may be a schottky barrier contact 326 formed at the top surface 314 of the substrate 302, which may advantageously improve a power efficiency of the BARITT diode 308. The source 326 of the BARITT diode 308 and the schottky barrier contact 356 of the NPN schottky bipolar transistor 306 may have substantially equal compositions as a result of being formed concurrently.

The drift region 328 may be a portion of the p-type semiconductor material 304, as described in reference to FIG. 1. The drift region 328 may be free of additional dopants beyond the dopants of the p-type semiconductor material 304. The collector 330 may be an n-type buried layer 330 as described in reference to FIG. 1 and formed as described in reference to FIG. 2A. The collector 330 of the BARITT diode 308 may be advantageously formed concurrently with the n-type buried layer 358 of the NPN schottky bipolar transistor 306. The dielectric isolation structure 332 may be field oxide formed by an STI process as depicted in FIG. 3, advantageously formed concurrently with the field oxide 324 in the NPN schottky bipolar transistor 306. In the instant example, the BARITT diode 308 may include a heavily doped n-type sinker 338 in the substrate 302 outside of the dielectric isolation structure 332, extending to the collector 330. The n-type sinker 338 may advantageously be formed concurrently with the n-type sinker 322 of the NPN schottky bipolar transistor 306. The BARITT diode 308 may further include an n-type collector contact region 340 in the substrate 302 above and contacting the deep n-type well 338. The collector contact region 340 and the emitter 350 of the NPN schottky bipolar transistor 306 may have substantially equal dopant distributions as a result of being formed concurrently, accruing additional advantages of fabrication cost reduction and simplification. The BARITT diode 308 may optionally be surrounded by another instance of the deep trench 342 which laterally isolates the collector 330 and the deep n-type well 338 from the p-type semiconductor material 304. Integrating the BARITT diode 308 in the integrated circuit 300 with other components such as the NPN schottky bipolar transistor 306 may advantageously reduce a fabrication and assembly cost of an electronic system containing the integrated circuit 300.

Figure 4:
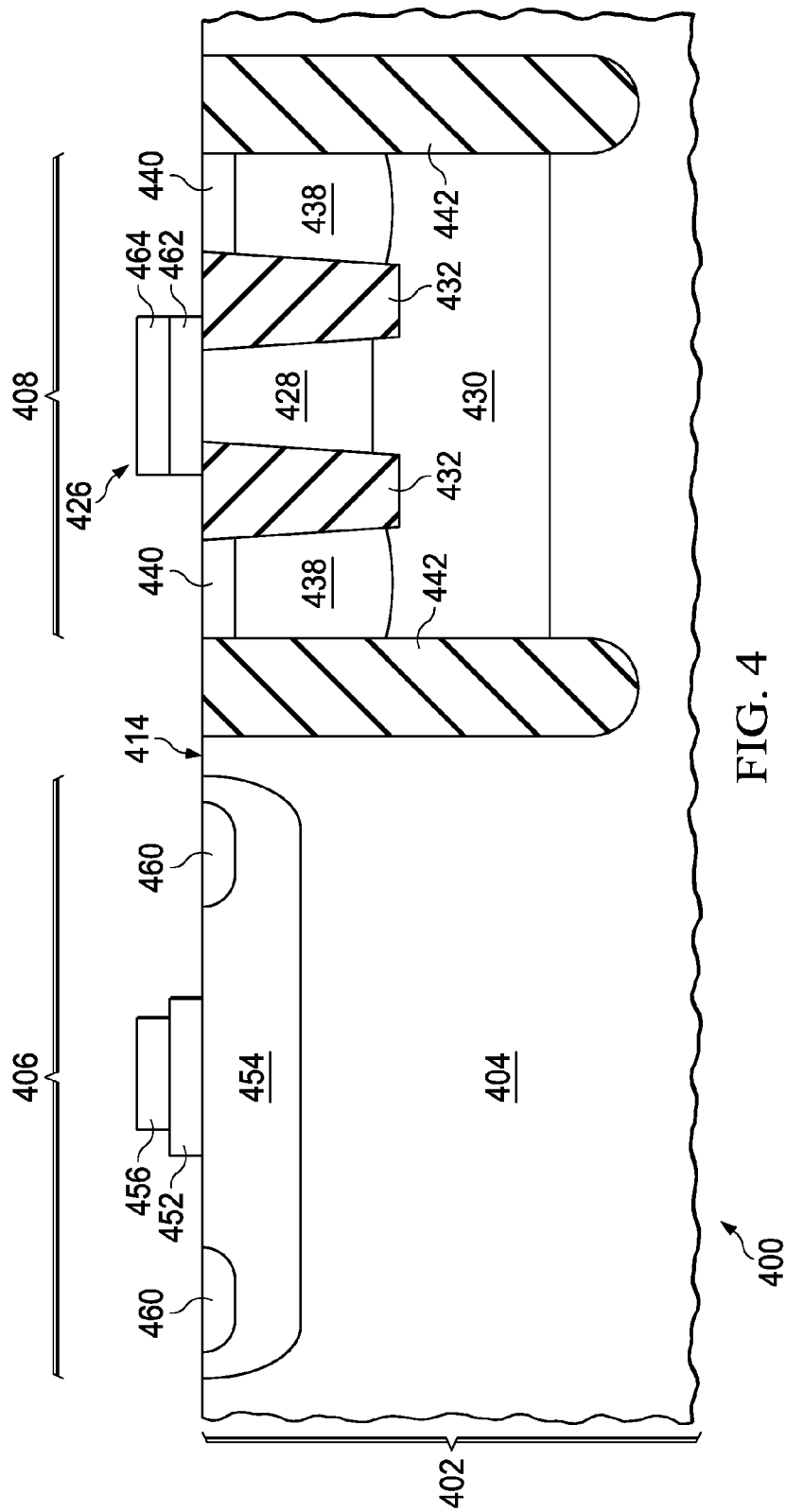
FIG. 4 is a cross section of another example integrated circuit containing a BARITT diode.

FIG. 4 is a cross section of another example integrated circuit containing a BARITT diode. The integrated circuit 400 is formed on a substrate 402 which includes a p-type semiconductor material 404 having a dopant density of $1 \times 10^{14}$ cm$^{-3}$ to $1 \times 10^{16}$ cm$^{-3}$. The integrated circuit 400 includes an NPN bipolar transistor 406 and the BARITT diode 408.

The NPN bipolar transistor 406 has an n-type collector 454 formed in the substrate 402. The collector 454 may be formed as a shallow n-type well. The NPN bipolar transistor 406 has an n-type emitter 456 formed of polysilicon on a p-type base 452 formed of silicon germanium by an epitaxial process. The base 452 is formed on a top surface 414 of the substrate 402, over the collector 454. The collector 454 extends to the top surface 414 of the substrate 402 and extends laterally adjacent to the base 452. N-type collector contact regions 460 may be formed in the collector 454 laterally separated from the base 452, with average dopant densities greater than $1 \times 10^{19}$ cm$^{-3}$ to provide low resistance connection to the NPN bipolar transistor 406.

The BARITT diode 408 includes a source 426, a vertically oriented drift region 428 formed in the substrate 402 immediately below the source 426, and a collector 430 disposed in the substrate 402 immediately below the drift region 428. A dielectric isolation structure 432 laterally surrounds the drift region 428. The drift region 428 and the dielectric isolation structure 432 extend vertically from the source 426 to the collector 430. The drift region 428 is free of an external electrical connection besides the source 426 and the collector 430.

In the instant example, the source 426 may be a layer of n-type polysilicon 464 formed on a silicon germanium epitaxial layer 462 at the top surface 414 of the substrate 402, which may advantageously improve a power efficiency of the BARITT diode 408. The layer of n-type polysilicon 464 of the source 426 and the emitter 456 of the NPN bipolar transistor 406 may have substantially equal compositions as a result of being formed concurrently, accruing advantages of fabrication cost reduction and simplification. The silicon germanium epitaxial layer 462 of the source 426 and the base 452 of the NPN bipolar transistor 406 may also have substantially equal compositions as a result of being formed concurrently, accruing additional advantages of fabrication cost reduction and simplification. In the instant example, the drift region 428 extends to the top surface of the substrate 402. The drift region 428 may be a portion of the p-type semiconductor material 404, as described in reference to FIG. 1. The drift region 428 may be free of additional dopants beyond the dopants of the p-type semiconductor material 404. The collector 430 may be an n-type buried layer 430 as described in reference to FIG. 1 and formed as described in reference to FIG. 2A. The dielectric isolation structure 432 may be field oxide formed by an STI process as depicted in FIG. 4, possibly formed concurrently with other field oxide elements in the integrated circuit 400, accruing further advantages of fabrication cost reduction and simplification.

In the instant example, the BARITT diode 408 may include a heavily doped n-type sinker 438 in the substrate 402 outside of the dielectric isolation structure 432, extending to the collector 430. The BARITT diode 408 may further include an n-type collector contact region 440 in the substrate 402 above and contacting the deep n-type well 438. The collector contact region 440 and the collector contact regions 460 of the NPN bipolar transistor 406 may have substantially equal dopant distributions as a result of being formed concurrently, accruing the aforementioned advantages of fabrication cost reduction and simplification. The BARITT diode 408 may optionally be surrounded by a deep trench 442 which laterally isolates the collector 430 and the deep n-type well 438 from the p-type semiconductor material 404. Integrating the BARITT diode 408 in the integrated circuit 400 with other components such as the NPN bipolar transistor 406 may advantageously reduce a fabrication and assembly cost of an electronic system containing the integrated circuit 400.

Figure 5:
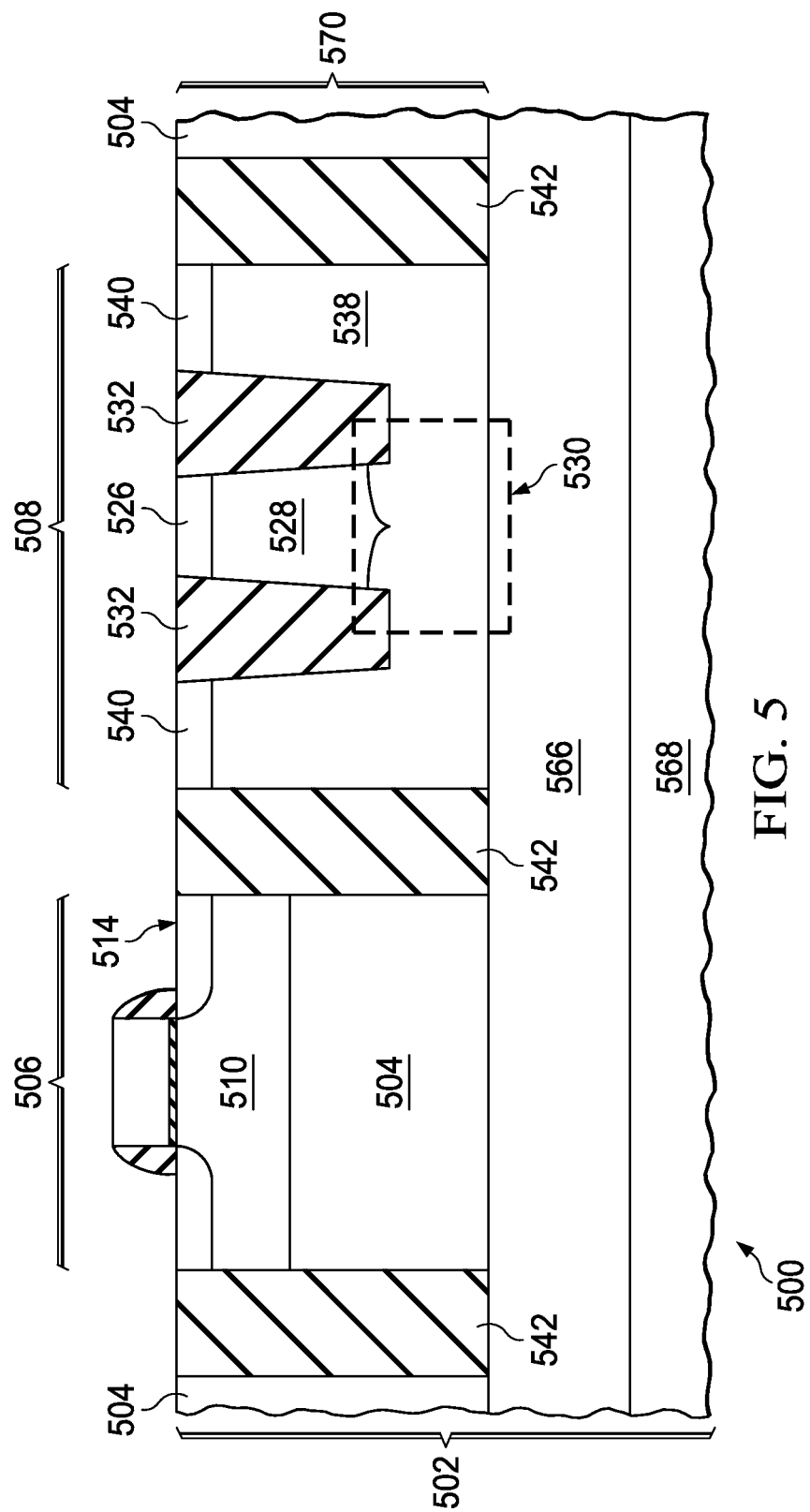
FIG. 5 is a cross section of a further example integrated circuit containing a BARITT diode, formed on an SOI substrate.

FIG. 5 is a cross section of a further example integrated circuit containing a BARITT diode, formed on a silicon-on-insulator (SOI) substrate. The SOI substrate 502 includes a p-type semiconductor material 504 in a device layer 570 over a buried oxide layer 566. The p-type semiconductor material 504 has a dopant density of $1 \times 10^{14}$ cm$^{-3}$ to $1 \times 10^{16}$ cm$^{-3}$. The buried oxide layer 566 is disposed on a handle wafer 568 of the SOI substrate 502. The integrated circuit 500 includes an NMOS transistor 506 and the BARITT diode 508 in the device layer 570. In the instant example, the NMOS transistor 506 and the BARITT diode 508 are laterally isolated by deep trenches 542.

In the instant example, the NMOS transistor 506 is formed in a shallow p-type well 510 as described in reference to FIG. 1 and FIG. 2D. The NMOS transistor 506 has the elements described in reference to the NMOS transistor 106 of FIG. 1.

The BARITT diode 508 includes a source 526, a vertically oriented drift region 528 disposed in the substrate 502 immediately below the source 526, and a collector 530 disposed in the substrate 502 immediately below the drift region 528. A dielectric isolation structure 532 laterally surrounds the drift region 528. The drift region 528 is free of an external electrical connection besides the source 526 and the collector 530. The drift region 528 and the dielectric isolation structure 532 extend vertically from the source 526 to the collector 530. The source 526 may be formed as described in any of the examples disclosed herein. The drift region 528 may be a portion of the p-type semiconductor material 504 and may be free of additional dopants beyond the dopants of the p-type semiconductor material 504. In the instant example, the collector 530 may be formed by lateral diffusion of n-type dopants of a deep n-type well 538 which extends to a top surface 514 of the substrate 502 outside of the dielectric isolation structure 532. The deep n-type well 538 may be formed as described in reference to FIG. 2C. N-type collector contact regions 540 may be formed in the deep n-type well 538 outside of the dielectric isolation structure 532, as described in reference to FIG. 2F. Integrating the BARITT diode 508 in the integrated circuit 500 with other components such as the NMOS transistor 506 may accrue the advantages discussed in reference to the other examples disclosed herein.

Figure 6:
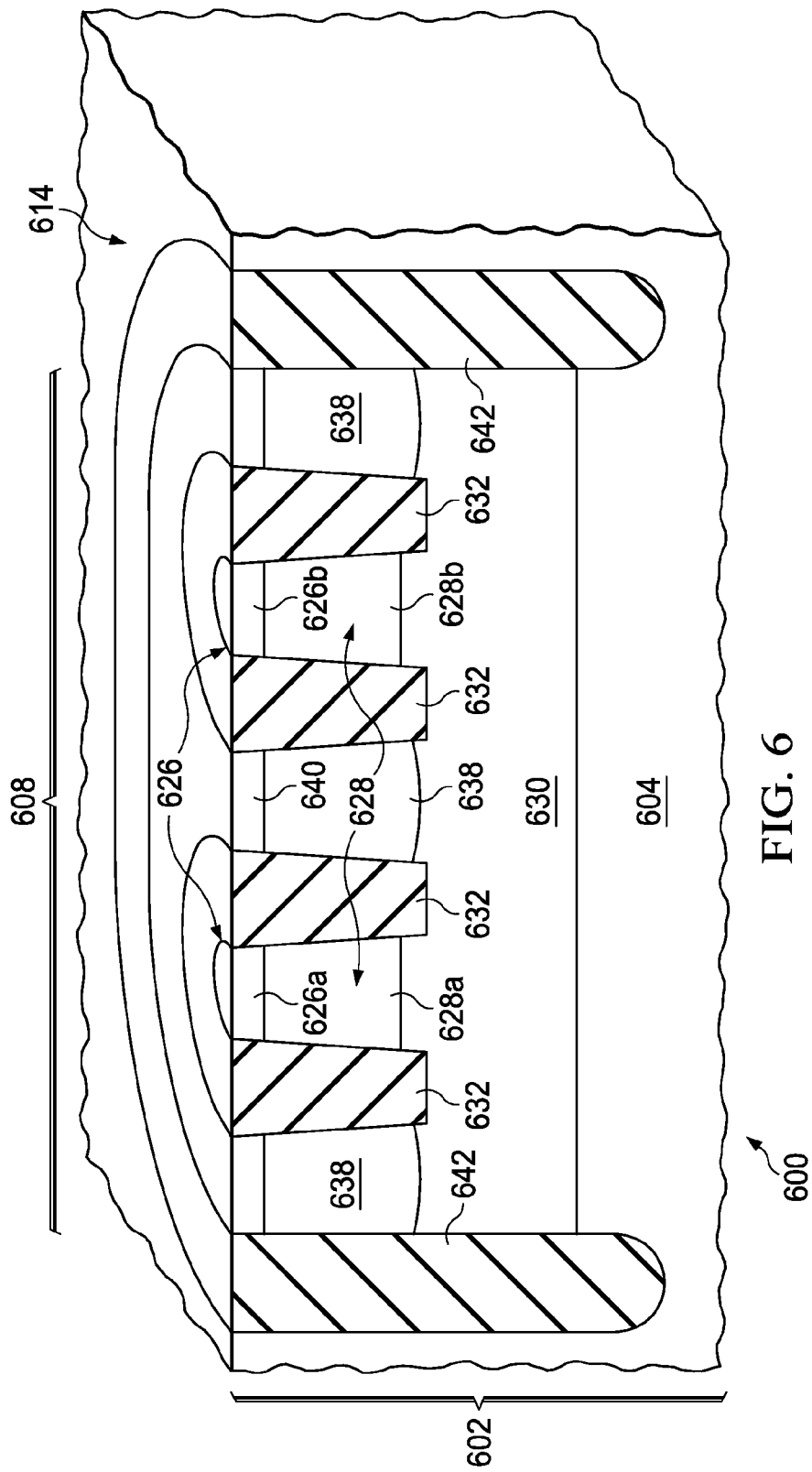
FIG. 6 is a cross section of another example integrated circuit containing a BARITT diode.

FIG. 6 is a cross section of another example integrated circuit containing a BARITT diode. The integrated circuit 600 is formed in a substrate 602 which may be a silicon wafer, possibly with an epitaxial layer, or may be an SOI substrate. The substrate 602 includes a p-type semiconductor material 604 having a dopant density of $1 \times 10^{14}$ cm$^{-3}$ to $1 \times 10^{16}$ cm$^{-3}$, which extends to a top surface 614 of the substrate 602. The integrated circuit 600 includes the BARITT diode 608 and at least one transistor, such as the transistors described in the examples disclosed herein.

In the instant example, the BARITT diode 608 includes a distributed source 626 with a first source segment 626a and a separate second source segment 626b, a distributed vertically oriented drift region 628, with a first drift region segment 628a and a separate second drift region segment 628b, disposed in the substrate 602 immediately below the first source segment 626a and the second source segment 626b respectively, and a collector 630 disposed in the substrate 602 immediately below the distributed drift region 628. A dielectric isolation structure 632 laterally surrounds the first drift region segment 628a and the second drift region segment 628b. The drift region 628 is free of an external electrical connection besides the source 626 and the collector 630. The drift region 628 and the dielectric isolation structure 632 extend vertically from the source 626 to the collector 630.

The source 626 may be formed as described in any of the examples disclosed herein. The drift region 628 may be a portion of the p-type semiconductor material 604 and may be free of additional dopants beyond the dopants of the p-type semiconductor material 604. The collector 630 may be formed as described in any of the examples disclosed herein. A deep n-type well 638 and an n-type collector contact region 640 may be formed in the substrate 602 outside of the dielectric isolation structure 632 surrounding the first drift region segment 628a and the second drift region segment 628b. The BARITT diode 608 may be surrounded by an optional deep trench 642 which laterally isolates the collector 630 and the deep n-type well 638 from the p-type semiconductor material 604. Forming the BARITT diode with the distributed source 626 and the distributed drift region 628, surrounded by the deep n-type well 638, may advantageously enable operation of the BARITT diode 608 at a desired current while providing a desired low series resistance.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a substrate comprising a semiconductor material having a first conductivity type;
    a transistor of the integrated circuit; and
    a barrier injection transit-time (BARITT) diode, comprising:
        a source disposed proximate to a top surface of the substrate;
        a vertically oriented drift region disposed in the semiconductor material immediately below the source, the drift region having the first conductivity type;
        a collector disposed in the substrate immediately below the drift region, the collector having a second, opposite, conductivity type; and
        a dielectric isolation structure laterally surrounding the drift region, the dielectric isolation structure extending from the source to the collector, the vertically oriented drift region being free of an external electrical connection other than the source and the collector.

2. The integrated circuit of claim 1, wherein:
    the first conductivity type is p-type;
    the second conductivity type is n-type; and
    the collector is an n-type buried layer.

3. The integrated circuit of claim 1, wherein the dielectric isolation structure is field oxide with a shallow trench isolation (STI) structure, the dielectric isolation structure being 2 microns to 5 microns deep in the substrate.

4. The integrated circuit of claim 1, wherein:
    the first conductivity type is p-type;
    the second conductivity type is n-type; and
    the source is an n-type diffused region disposed in the substrate, the source having a substantially equal n-type dopant distribution to an n-type source/drain region of an n-channel metal oxide semiconductor (NMOS) transistor in the integrated circuit.

5. The integrated circuit of claim 1, wherein the source includes a schottky barrier contact.

6. The integrated circuit of claim 1, wherein the source includes a silicon germanium layer.

7. The integrated circuit of claim 6, wherein the silicon germanium layer of the source of the BARITT diode has a substantially equal composition as a silicon germanium layer in a base of a bipolar transistor in the integrated circuit.

8. The integrated circuit of claim 1, wherein the BARITT diode comprises a deep well having the second conductivity type surrounding the dielectric isolation structure and extending to the collector.

9. The integrated circuit of claim 1, wherein the substrate is a silicon-on-insulator (SOI) substrate.

10. The integrated circuit of claim 1, wherein:
    the source is a distributed source having a first source segment and a separate second source segment; and
    the drift region is a distributed drift region having a first drift region segment and a separate second drift region segment.

11. A method of forming an integrated circuit, comprising the steps:
    providing a substrate comprising a semiconductor material having a first conductivity type;
    forming a transistor of the integrated circuit; and
    forming a BARITT diode, by a process comprising the steps:
        forming a collector in the substrate, the collector having a second, opposite, conductivity type;
        forming a dielectric isolation structure laterally surrounding a vertically oriented drift region of the BARITT diode in the semiconductor material immediately above the collector, the drift region having the first conductivity type, the dielectric isolation structure extending to the collector; and
        forming a source proximate to a top surface of the substrate, the source being immediately above the drift region, the vertically oriented drift region being free of an external electrical connection other than the source and the collector.

12. The method of claim 11, wherein:
the first conductivity type is p-type;
the second conductivity type is n-type; and
forming the collector comprises implanting n-type dopants into a first portion of the semiconductor material of the substrate and subsequently forming an epitaxial layer of the semiconductor material on the first portion of the semiconductor material, to form a buried layer which is the collector.

13. The method of claim 11, wherein forming the dielectric isolation structure comprises forming field oxide with an STI process comprising:
forming a polish stop layer over the top surface of the substrate;
forming isolation trenches through the stop layer and 2 microns to 5 microns deep in the substrate;
forming a layer of thermal oxide on sidewalls and bottoms of the isolation trenches;
filling the isolation trenches with primarily silicon dioxide-based dielectric material;
removing the dielectric material from over the stop layer by a chemical mechanical polish (CMP) process, leaving the dielectric material in the isolation trenches; and
removing the stop layer.

14. The method of claim 11, wherein:
the first conductivity type is p-type;
the second conductivity type is n-type; and
forming the source comprises implanting n-type dopants into the substrate above the drift region and into the substrate in an n-type source/drain region of an NMOS transistor in the integrated circuit, concurrently.

15. The method of claim 11, wherein forming the source comprises forming a layer of metal on the top surface of the substrate over the drift region to form a schottky barrier contact.

16. The method of claim 11, wherein forming the source comprises forming a silicon germanium layer by an epitaxial process.

17. The method of claim 16, wherein the silicon germanium layer of the source of the BARITT diode is formed concurrently with a silicon germanium layer in a base of a bipolar transistor in the integrated circuit.

18. The method of claim 11, comprising forming a deep well having the second conductivity type surrounding the dielectric isolation structure and extending to the collector.

19. The method of claim 11, wherein the substrate is an SOI substrate.

20. The method of claim 11, wherein:
the source is a distributed source having a first source segment and a separate second source segment; and
the drift region is a distributed drift region having a first drift region segment and a separate second drift region segment.

* * * * *